(12) United States Patent
Hsu et al.

(10) Patent No.: US 6,236,617 B1
(45) Date of Patent: May 22, 2001

(54) HIGH PERFORMANCE CMOS WORD-LINE DRIVER

(75) Inventors: Louis L. Hsu, Fishkill, NY (US); Hans-Oliver Joachim, Munich (DE); Matthew R. Wordeman, Mahopac, NY (US); Hing Wong, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/458,878

(22) Filed: Dec. 10, 1999

(51) Int. Cl.[7] ..................................... G11C 8/00
(52) U.S. Cl. ....................................... 365/230.06
(58) Field of Search ......................... 365/230.06, 226

(56) References Cited

U.S. PATENT DOCUMENTS

| | | | |
|---|---|---|---|
| 5,712,823 | * 1/1998 | Gillingham | 365/230.06 |
| 5,940,343 | * 8/1999 | Cha et al. | 365/230.06 |
| 6,049,503 | * 4/2000 | Khang | 365/230.06 |

* cited by examiner

Primary Examiner—Trong Phan
(74) Attorney, Agent, or Firm—Eric W. Petraske

(57) ABSTRACT

A negative wordline DRAM array having n groups of m wordlines, in which one group is driven by a group decoder circuit (having a voltage swing between ground and a circuit high voltage (2 v)) and one driver circuit in each group is exposed to a boosted wordline high voltage (2.8 v) greater than the circuit high voltage, in which the wordline driver circuits have an output stage comprising a standard nfet in series with a high threshold voltage pfet, so that, during activation, the unselected driver circuits exposed to the boosted wordline high voltage have a very low leakage through the pfet, while the selected driver circuit has a high but tolerable leakage (2 $\mu$A) because Vqs on the nfet is nearly at the nfet threshold. The net active power from the entire array is less than that of a conventional configuration due to the reduced voltage swing, while the number of transistors exposed to high voltage stress is reduced from 9 to 1 and the number of buffer nfets required to reduce voltage drop across an active nfet is reduced from 8 to 1.

16 Claims, 3 Drawing Sheets

HIGH PERFORMANCE CMOS WORD-LINE DRIVER

FIELD OF THE INVENTION

The field of the invention is that of DRAM circuits, in particular circuits for driving the signals that activate a DRAM cell in a negative wordline configuration.

BACKGROUND OF THE INVENTION

The negative word line technique, in which the gate of the transfer transistor in a DRAM cell is maintained at a bias voltage below ground ($V_{ss}$) is commonly used to increase retention time by reducing leakage through the transfer transistor.

When this is done, the voltage swing on the wordline driver circuit is increased, as there is now a greater voltage swing (from $V_{ss}$ to the boosted driver voltage $V_{pp}$) than was the case when the low bias voltage is at ground, and there is greater voltage stress on the devices in the driver circuit and therefore decreased reliability.

The art has addressed this situation by placing a buffer nfet in series in the driver output stage, by increasing the thickness of the gate oxide in the driver pfet and by increasing the channel length on the devices. These approaches impose extra cost on the circuit.

In one example, shown in "Offset Word-Line Architecture for Scaling DRAMs to the Gigabit Level", in the IEEE Journal of Solid State Circuits, Vol 23, No. 1, February 1988, the authors propose a scheme for a grounded (not negative) wordline, in which the wordline driver includes a high-threshold pfet and a low-threshold nfet. The result is that the leakage current through the selected wordline is reduced, but the leakage current on all the non-selected wordlines is increased, so that the total leakage from the circuit during standby will be unacceptably high.

SUMMARY OF THE INVENTION

The invention relates to a wordline driver circuit (and associated circuits for supplying the wordline voltage and for selecting the wordline driver circuit) for a memory array that has a higher than normal leakage output stage, is driven by a decoder circuit with a reduced voltage swing, and has a power supply voltage also having a reduced voltage swing. The number of transistors subject to voltage stress is reduced and the area consumed by the circuit is reduced. The active power required to operate a driver according to the invention is reduced because of the reduced voltage swing.

A feature of the invention is the use of inverters with a pfet having a higher than normal threshold, so that leakage current in the group of unselected drivers exposed to the wordline high voltage is reduced.

Another feature of the invention is a reduction in the number of buffer nfets required to avoid hot-carrier problems, thereby saving space.

DESCRIPTION OF THE PREFERRED EMBODIMENT

Figure 4:
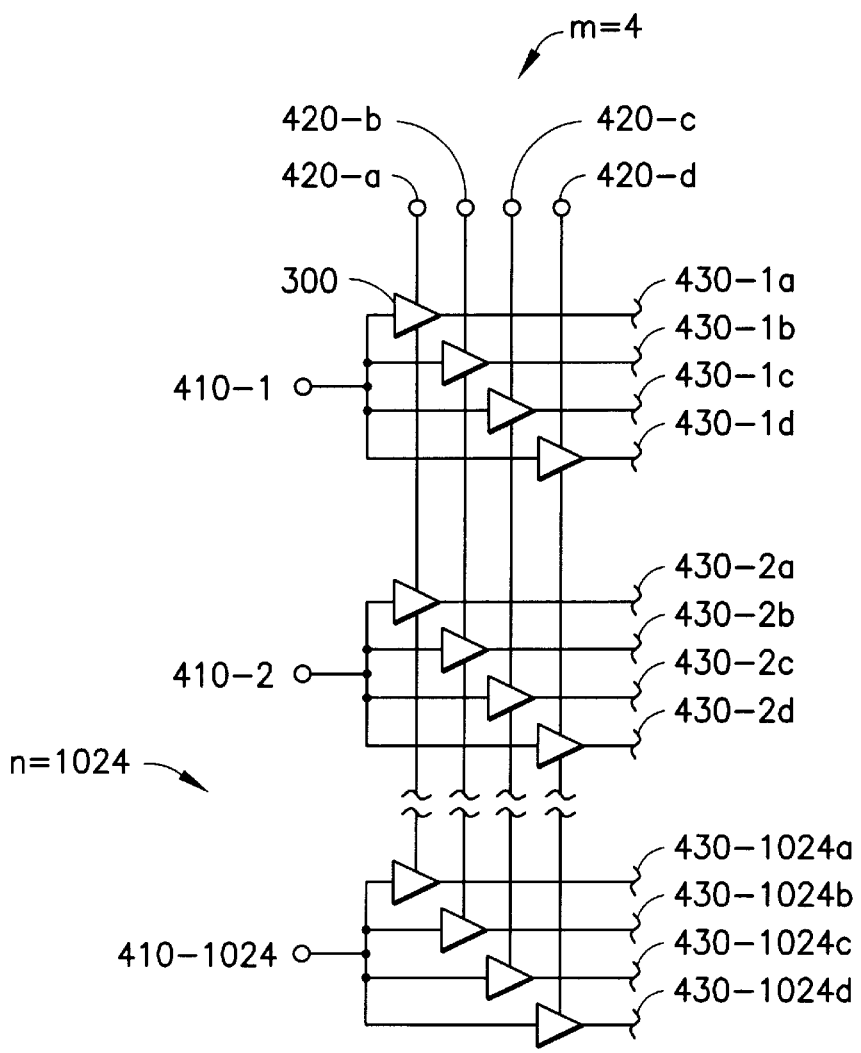
FIG. 4 illustrates the configuration of one block of driver circuits within a DRAM array.

Referring to FIG. 4, there is shown schematically a set of wordline driver circuits for one block in a DRAM array. The example shown is a set of 1024 groups of 4 drivers each, but many other arrangements could be chosen. Each driver circuit is represented by the symbol of an inverter, though, as will be seen, there is an additional transistor to restore the quiescent configuration to the wordlines. At the top of the figure, there are four voltage supply nodes 420-1 to 420-4 that are maintained by a corresponding voltage supply selector circuit at 0.7 v ($V_m$) for the lines that remain in the quiescent state and at a wordline high voltage of 2.8 v for the active line. The value of 2.8 v is boosted above the standard circuit high voltage of 2.0 v in order to provide better drive on the cell transistor. This is a common arrangement and the auxiliary circuits to generate the boosted voltage are well known to those skilled in the art. The particular voltage values are not important and will decline in magnitude as geometries shrink and the threshold voltages of the array transfer devices drop.

Figure 1:
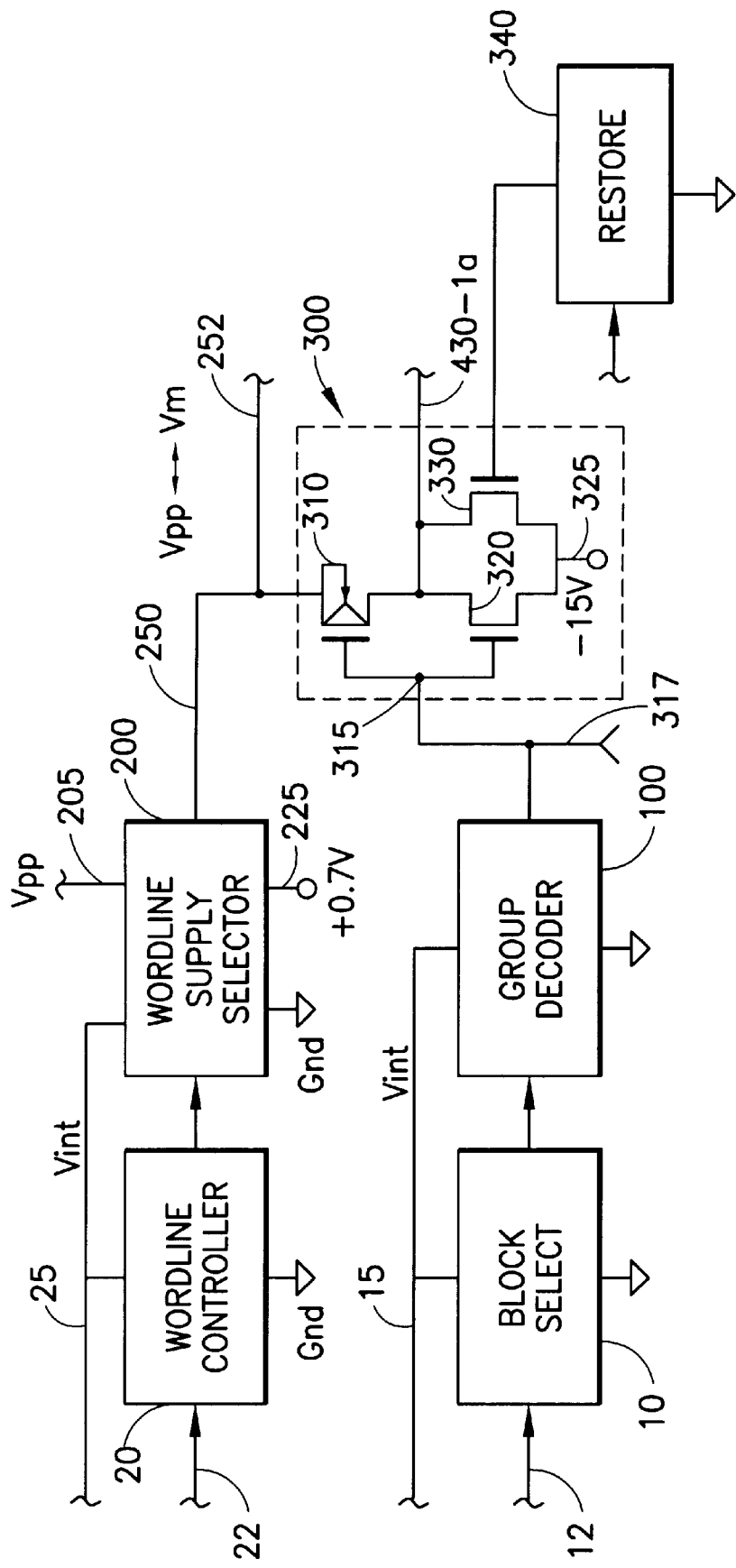
FIG. 1 illustrates a wordline driver circuit according to the invention, and associated auxiliary circuits.

On the left of the figure, a set of group gate nodes 410-1 through 410-1024 are driven by a row decoder circuit. In the quiescent state, these nodes are all at the circuit high voltage and the selected group node is dropped to ground (or, in some schemes, to a negative wordline low voltage, e.g.—0.5 v). Thus, 1024 drivers are exposed to the high driver voltage, of which only the selected one is turned on. All of the circuits will have DC leakage during the active state, of course and a significant benefit of the invention is the reduction of leakage in the 1023 drivers that are exposed to the high voltage. It is a beneficial aspect of the present invention that the active power is reduced, even though, as will be seen, the driver circuits are constructed so that the selected circuit is leakier that the conventional approach. Referring now to FIG. 1, the selected driver circuit is shown, denoted generally by the numeral 300, in the lower right corner. Pfet 310, a high threshold (−1.2 v) device is connected to line supply 250, which is driven by voltage supply selector circuit (wordline selector) 200. Pfet 310 is in series with nfet 320, a standard nfet in this embodiment, that is connected between wordline 430-1a and the negative low bias voltage (−0.5 v) on terminal 325, so that the wordline voltage swing is between −0.5 v and 2.8 v. A restore transistor 330, driven by restore circuit 340 opens a path between terminal 325 and wordline 430-1a to restore the quiescent state on the wordline. The gates of both transistors 310 and 320 are tied to node 315, which switches between ground and the circuit high voltage of 2 v in response to a group selection signal from group decoder circuit 100. When selected, transistor 310 will be turned hard on, but transistor 320 will have a value of $V_{gs}$ of 0.5 v, nearly at its standard threshold of 0.66 v, and will pass a tolerable leakage current.

The selected driver leakage current for a circuit having goundrules of 0.25 μm has been modeled and is calculated to be 1.38 μA, more than twice the leakage current for the same driver having a conventional gate voltage (in the negative wordline configuration) of −0.5 v. The total leakage from pfets 310 in the various drivers is summarized in Table 1. The first row shows the voltage of line 250 of the driver. The second row shows the voltage on the gate node 315. All of the pfets have a threshold of −1.2V and a drain voltage of −0.5V (on the wordline 430-k). In the unselected drivers attached to lines 420-b through 420-c (3×1023) the total leakage current is 0.51 μA. The leakage from the 1023 pfets exposed to the wordline high voltage on line 420-a is 0.15

μA, for a total active current leakage of 2.04 μA. (The leakage from the pfets in the drivers on lines 430-1a–430-1c is negligible and the leakage from the nfet in driver 300 makes up the remainder.) Since the total chip current during the active period is milliamps, this amount of leakage current is easily tolerated.

TABLE 1

| $V_{250}$ | 0.7 V | 2.8 V | 0.7 V |
|---|---|---|---|
| $V_{315}$ | 2 V | 2 V | 0 V |
| # | 3 × 1023 | 1 × 1023 | 3 |
| $I_{leakage}$ | 0.51 μA | 0.15 μA | 0 μA |

Referring again to FIG. 1, the auxiliary circuits are illustrated. Wordline controller 20, a conventional circuit that is not illustrated in detail here, decodes the address information and turns on wordline selector 200 to pass the wordline supply voltage on line 250 to the selected set of wordline drivers (e.g. line 420-a in FIG. 4). One such driver circuit is illustrated (circuit 300 that drives line 430-1a in FIG. 4), with stub 252 indicating that 1023 other wordline drivers also receive the voltage. The total voltage supply circuit includes three additional circuits 200 for supplying lines 420-b, 420-c and 420-d in FIG. 4. Both circuits 20 and 200 receive the standard high voltage (2 v) on line 25. Only the last stage of circuit 200 is exposed to the boosted wordline driver voltage $V_{pp}$ on line 205. At the bottom of the figure, block select circuit 10, a conventional circuit that is not illustrated in detail here, operates on its input signal on line 12 to pick the particular block and activates row decoder 100, which drives the gates of the selected group of four drivers. The other three drivers in the selected group will be gated by connection to stub 317 and are not shown in FIG. 1. Line 15 is the voltage supply line carrying the internal supply voltage of the chip (e.g. 2.0 v) to circuits 10 and 100.

Figure 2:
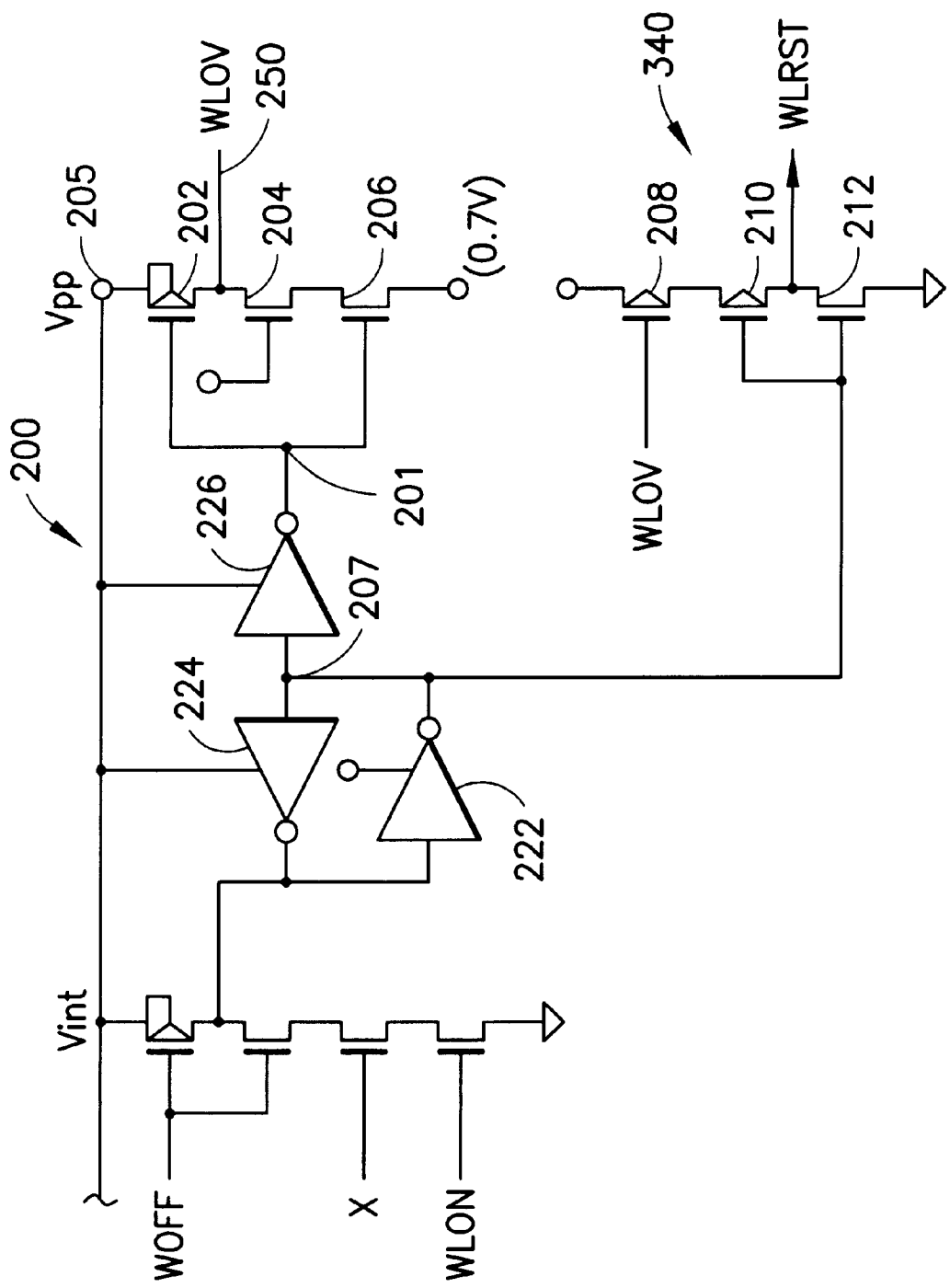
FIG. 2 illustrates a voltage supply selector circuit for supplying the wordline voltage to the selected wordline driver.

Referring now to FIG. 2, a circuit 200, commonly called a word line selector, illustrates a conventional logic arrangement in which a three-input NAND gate responds to wordline off, wordline on signals and to an address signal labelled X that selects this particular circuit. When the circuit is activated and selected, the wordline on and X will both be "high", and the wordline off will be at "low". This will pull the output node of the NAND gate to ground. Consequently, a "high" state will be stored in node 207 by a latch that is formed by inverters 224 and 222. The corresponding "low" state on node 201 will provide a path for a boosted "high" level $V_{pp}$ (e.g. 2.8 v) from terminal 205 through an output stage to line 250. The output stage comprises a pull-up pfet 202, a buffer nfet 204 and a pull-down nfet 206. The boosted high output voltage $V_{pp}$ is supplied from a conventional charge pump. This voltage will be supplied to lines 250 and 252 in FIG. 1, and one of four lines (420-i) of 1024 groups in FIG. 4. Also, the stored "high" state in node 207 will deactivate the restore circuit 340 as described in FIG. 1 which comprises a first pull-up pfet 208, a second pull-up pfet 210 and a pull-down nfet 212. For all the (n-1), e.g. 1023, wordline drivers connected to line 420-i that are not decoded, the boosted high level WLDV on line 250 will shut pfet 208 in the restore circuits hard off, so that there will be less DC leakage current flowing from $V_{pp}$ to ground in the restore circuit than if the internal logic high voltage (e.g. 2. v) were used.

Referring again to FIG. 1, the m driver circuits connected to node 315, 317 will have the selected restore circuit deactivated and the remaining three unselected circuits activated. The illustrated driver will pass $V_{pp}$ on to wordline 430-1a, since WLDV connected to that driver is at Vpp. However, for the remaining (m-1) drivers in that group, the WLDV signals are kept at Vm (e.g. 0.7V) level and even though the gates of those drivers are pulled low, the high Vt (about -1.2V) of the pfet device 310, will not prevent the output of those drivers from being maintained by the restore circuit at a negative level (or -0.5V).

The output stage comprises a modified inverter with pullup pfet 202 (having its body at the boosted voltage $V_{pp}$), pulldown nfet 206 and buffer nfet 204, which is placed there to carry some of the voltage drop and reduce voltage stress and hot electron effects in transistor 206. It is an advantageous feature of the invention that space is saved because only one buffer nfet is required, in contrast to the corresponding previous circuit which normally had eight buffer nfets in the selector and decoder blocks. The low voltage terminal connected to transistor 206 has an optional voltage of +0.7 v placed in parentheses. If this optional voltage is used, then buffer transistor 204 can also be eliminated, saving additional space.

Figure 3:
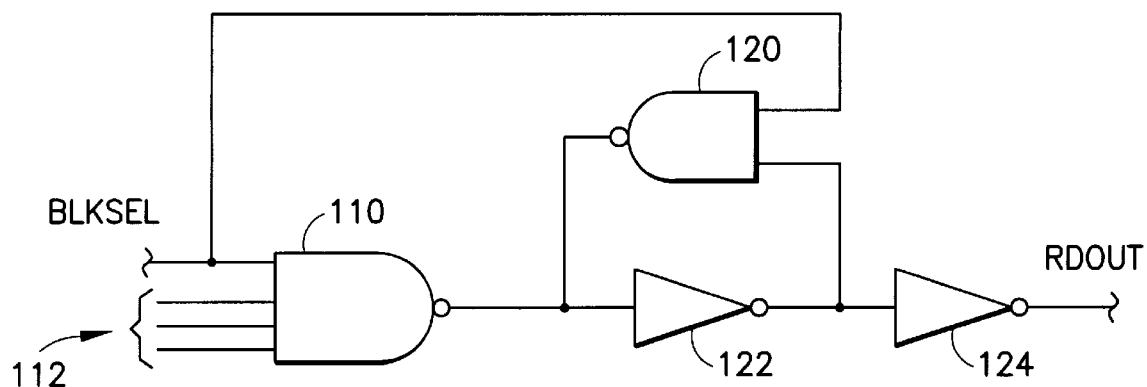
FIG. 3 illustrates a group decoder circuit for selecting the m drivers in one of n groups.

Referring now to FIG. 3, there is shown the details of circuit 100, in which two NAND circuits on the left respond to a timing signal for block selection and a set of decoder inputs 112 that select this block. The signal to activate the group of 4 drivers passes out to line 315–317. Advantageously, all the subcircuits in blocks 100 and 200 (except for the output stage in block 200) are connected to the standard voltage levels (ground and 2. v) so that only transistor 202 in FIG. 2 is exposed to the boosted voltage (ground on the gate and 2.8 v on the source). The output voltage at WLDV 210 will switch from 0.7 v to 2.8 v. The advantage of this reduced voltage swing both increases the reliability of the integrated circuit and also reduces the active power.

The following Table 2 summarizes differences between three possibilities using the same basic structure shown in FIG. 1: A) the voltage swing on both the gates of the wordline drivers and on the wordline is between -0.5 v and 2.8 v; B) the voltage swing is between 0 v and 2.8 v; and C) according to the invention, the voltage swing on the gates is between 0 v and 2.0 v and the voltage swing on the wordline supply is between 0.7 v and 2.8 v.

TABLE 2

|  | A | B | C |
|---|---|---|---|
| Delay | 6.75 ns | 6.58 ns | 6.7 ns |
| Total DC Current | 0.62 μA | 1.38 μA | 2.0 μA |
| Active power | 2.76 mW | 2.34 mW | 2.24 mW |
| # of high stress devices | 9 | 9 | 1 |
| # of buffer nfets | 8 | 8 | 1 |

The reliability of the wordline circuits is always the most critical part of memory the circuit design. This is because this circuit will experience the highest gate oxide stress, as well as being susceptible to hot-carrier failure caused by high device drain to source voltage. A reliability test is carried out, for example, to accelerate such failures by applying 1.5× of the normal voltage at a high temperature for couple of days. In a circuit according to the present invention, with reduced swing on the wordline group decoder as well as on the wordline supply selector, those skilled in the art will appreciate the improvement on the gate oxide stress and reduction on hot-carrier susceptibility on the driver circuits. As summarized in Table 3, the present invention is compared with a conventional scheme for both driver and selector circuits. The driver circuit will have a 500 mV reduction on the gate oxide stress of the pfet device when the driver is activated. In addition, there will be an 800 mV reduction on the nfet gate oxide stress. Similarly, for the supply selector circuit, the present invention will have 500 mV less gate oxide stress on the pfet device when the circuit is activated, and 1.9V less gate oxide stress on the nfet device when it is not activated. Furthermore, the selector nfet device will have 400 mV less drain to source voltage compared to that of an nfet in a conventional circuit equipped with a buffered device.

Normally, due to the fact that electrons have a higher mobility than holes, the hot carrier problem is more serious in nfets than in pfets. Therefore, the proposed method eliminates this concern and thus improves the circuit quality greatly.

Those skilled in the art will appreciate that the delay and the active power are smaller in the circuits constructed according to the invention than in the prior art configurations, while the number of stressed devices is considerably less (which improves reliability) and the area required is also considerably less.

An option that may be implemented is providing nfet transistors 320 and 330 in the driver circuits with a high threshold in order to reduce leakage current in the selected driver circuit. A circuit designer will have to decide if the extra cost is justified by the reduced current leakage.

Another advantageous feature of the invention is that the high pfet threshold may be provided without an additional implant step or an additional mask. Conventionally, in DRAM processing, an N-well implant is applied uniformly to the support area. Support pfet devices located in the support area are implanted with a P-type counter-doping implant to raise their threshold voltage to a standard value such as −0.6 v. According to the invention, the high-threshold pfets in the support area are formed with only the N-well implant; i.e. the high-threshold transistors do not receive the counter-doping pfet implant. In a process in which the N-well implant is [P$^+$] at 500 keV 2.5×10$^{13}$, and 140 keV 2×10$^{12}$ and [As$^+$] 200 keV 2.7×10$^{12}$, that implant can be applied to the body of the high-threshold pfets and will produce a pfet threshold of between −1.1V and −1.2V. This result of forming pfet devices with two thresholds is accomplished by removing the locations of the high-threshold transistors from the mask that defines the pfet implant. Therefore it doesn't require any extra process steps or extra cost. In other words, the high threshold voltage of the pfet devices is set during the N-well implant.

The processing of wafers according to this invention can therefore be summarized as: a) implanting the array; b) performing the N-well implant in the support area; c) performing the counter-doping pfet implant only in the locations of standard threshold pfets (so that high-threshold pfets are available for the wordline drivers); forming the transistors and capacitors; and d) connecting the devices to form the circuit.

While the invention has been described in terms of a single preferred embodiment, those skilled in the art will recognize that the invention can be practiced in various versions within the spirit and scope of the following claims.

We claim:

1. An integrated circuit including a memory array having a set of memory cells controlled by a set of wordlines that are arranged in n groups of m wordlines, each of said set of wordlines being driven by a wordline driver circuit for supplying a boosted wordline high voltage and a negative wordline low voltage, said wordline high voltage being greater than a circuit high voltage supplied to other circuits within said integrated circuit, whereby said selected wordline has a wordline voltage swing that is greater than a standard voltage swing between ground and said circuit high voltage;

a voltage supply selector circuit for exposing one wordline driver circuit in each group to said boosted wordline high voltage;

a group decoder circuit for driving all of the wordline driver circuits in a decoded group with a group selection signal having a reduced voltage swing less than said wordline voltage swing, whereby a selected wordline driver circuit supplies said boosted wordline high voltage to a selected wordline connected to said selected wordline driver circuit;

said wordline driver circuit has an output stage comprising an nfet connected between said negative wordline low voltage and said wordline and a pfet, having a pfet threshold voltage that is greater in magnitude than a standard pfet threshold voltage, connected between said wordline and said voltage supply selector circuit, whereby n−1 unselected wordline driver circuits exposed to said boosted wordline high voltage have low leakage and reduced gate stress and whereby a selected wordline driver circuit has an nfet having a gate-to-source voltage greater than zero and a non-selected wordline circuit has reduced gate stress.

2. An integrated circuit according to claim 1, in which said voltage supply selector circuit supplies m−1 wordline driver circuits in each group with a voltage at ground.

3. An integrated circuit according to claim 1, in which said voltage supply selector circuit supplies m−1 wordline driver circuits in each group with said positive wordline low voltage and in which said positive wordline low voltage is greater than the absolute magnitude of said pfet threshold voltage.

4. An integrated circuit according to claim 1, in which a first group decoder signal from said group decoder circuit supplies said decoded group with said negative wordline low voltage and n−1 group decoder signals from n−1 group decoder circuits supply n−1 groups of wordline driver circuits with said circuit high voltage.

5. An integrated circuit according to claim 1, in which a first group decoder signal from said group decoder circuit supplies said decoded group with ground and n−1 group decoder signals from n−1 group decoder circuits supply n−1 groups of wordline driver circuits with said circuit high voltage.

6. An integrated circuit according to claim 2, in which a first group decoder signal from said group decoder circuit supplies said decoded group with said negative wordline low voltage and n−1 group decoder signals from n−1 group decoder circuits supply n−1 groups of wordline driver circuits with said circuit high voltage.

7. An integrated circuit according to claim 2, in which a first group decoder signal from said group decoder circuit supplies said decoded group with ground and n−1 group decoder signals from n−1 group decoder circuits supply n−1 groups of wordline driver circuits with said circuit high voltage.

8. An integrated circuit according to claim 3, in which a first group decoder signal from said group decoder circuit supplies said decoded group with said negative wordline low voltage and n−1 group decoder signals from n−1 group decoder circuits supply n−1 groups of wordline driver circuits with said circuit high voltage.

9. An integrated circuit according to claim 3, in which a first group decoder signal from said group decoder circuit supplies said decoded group with ground and n−1 group decoder signals from n−1 group decoder circuits supply n−1 groups of wordline driver circuits with said circuit high voltage.

10. An integrated circuit according to claim 1, in which said wordline driver circuit includes a pfet having a pfet threshold voltage that is greater in magnitude than a standard pfet threshold voltage.

11. An integrated circuit according to claim 1, in which said wordline driver circuit includes an nfet having a nfet threshold voltage that is greater in magnitude than a standard nfet threshold voltage.

12. An integrated circuit according to claim 2, in which said wordline driver circuit includes a pfet having a pfet threshold voltage that is greater in magnitude than a standard pfet threshold voltage.

13. An integrated circuit according to claim 2, in which said group decoder circuit has an output stage that includes an nfet having a nfet threshold voltage that is greater in magnitude than a standard nfet threshold voltage.

14. An integrated circuit according to claim 3, in which said group decoder circuit has an output stage that includes a pfet having a pfet threshold voltage that is greater in magnitude than a standard pfet threshold voltage.

15. An integrated circuit according to claim 3, in which said group decoder circuit has an output stage that includes an nfet having a nfet threshold voltage that is greater in magnitude than a standard nfet threshold voltage.

16. An integrated circuit according to claim 1, in which said voltage supply selector circuit includes a restore circuit that supplies m−1 wordline driver circuits in said decoded group with said negative wordline low voltage.

* * * * *